(12) United States Patent
An et al.

(10) Patent No.: US 12,677,401 B2
(45) Date of Patent: Jul. 7, 2026

(54) POWER CONVERSION DEVICE

(71) Applicant: LG INNOTEK CO., LTD., Seoul (KR)

(72) Inventors: Sang Hun An, Seoul (KR); Mi Sun Lee, Seoul (KR); Ji Hwan Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 216 days.

(21) Appl. No.: 18/020,508

(22) PCT Filed: Aug. 12, 2021

(86) PCT No.: PCT/KR2021/010727
§ 371 (c)(1),
(2) Date: Feb. 9, 2023

(87) PCT Pub. No.: WO2022/035253
PCT Pub. Date: Feb. 17, 2022

(65) Prior Publication Data
US 2023/0328937 A1      Oct. 12, 2023

(30) Foreign Application Priority Data

Aug. 12, 2020    (KR) ........................ 10-2020-0101382

(51) Int. Cl.
*H05K 7/20*          (2006.01)
(52) U.S. Cl.
CPC ..... *H05K 7/20909* (2013.01); *H05K 7/20145* (2013.01); *H05K 7/20172* (2013.01); *H05K 7/2039* (2013.01)
(58) Field of Classification Search
CPC ..... H05K 7/20; H05K 7/20136–20145; H05K 7/20154; H05K 7/20172; H05K 7/20209;
(Continued)

(56) References Cited

U.S. PATENT DOCUMENTS

| | | | |
|---|---|---|---|
| 8,687,357 B2* | 4/2014 | Nagano | H05K 7/20918 165/185 |
| 2005/0041392 A1* | 2/2005 | Chen | H05K 7/20727 361/695 |

(Continued)

FOREIGN PATENT DOCUMENTS

| | | |
|---|---|---|
| KR | 10-2003-0032772 | 4/2003 |
| KR | 10-2005-0027521 | 3/2005 |

(Continued)

OTHER PUBLICATIONS

International Search Report dated Nov. 30, 2021 issued in Application No. PCT/KR2021/010727.

(Continued)

*Primary Examiner* — Amir A Jalali
(74) *Attorney, Agent, or Firm* — KED & ASSOCIATES, LLP

(57)          ABSTRACT

A power conversion device comprises: a housing having a space therein, and including a first opening and a second opening; an electronic component arranged in the space; a duct having one end coupled to the first opening and the other end coupled to the second opening, and having a flow path through which air flows and which is divided from the space; and a fan which is arranged on one end of the duct and which allows air to flow in the flow path, wherein the electronic component includes a radiation fin protruding from the side surface thereof, and a coupling groove to which the radiation fin is coupled is arranged on the side surface of the duct.

18 Claims, 9 Drawing Sheets

(58) Field of Classification Search
CPC .... H05K 7/2039; H05K 7/20409; H05K 5/00; H05K 5/02; H05K 5/0213; H05K 5/0217; H02K 5/18; H01L 23/34; H01L 23/367; G06F 1/20; G06F 1/203; G06F 1/206
See application file for complete search history.

(56) References Cited

U.S. PATENT DOCUMENTS

| | | | |
|---|---|---|---|
| 2005/0057899 A1* | 3/2005 | Lord | F28F 3/048 |
| | | | 361/695 |
| 2006/0023420 A1* | 2/2006 | Tucker | G06F 1/20 |
| | | | 361/695 |
| 2009/0279247 A1* | 11/2009 | Chen | G06F 1/203 |
| | | | 361/679.47 |
| 2009/0314465 A1* | 12/2009 | Zheng | H01L 23/467 |
| | | | 165/80.3 |
| 2010/0079940 A1* | 4/2010 | Mongia | G06F 1/20 |
| | | | 361/679.49 |
| 2019/0035207 A1* | 1/2019 | Wasinger | H05K 7/20209 |

FOREIGN PATENT DOCUMENTS

| | | |
|---|---|---|
| KR | 10-1089420 | 12/2011 |
| KR | 10-1463784 | 11/2014 |
| KR | 10-2017-0135491 | 12/2017 |
| KR | 10-2020-0025215 | 3/2020 |

OTHER PUBLICATIONS

Korean Office Action dated Nov. 25, 2024 issued in Application No. 10-2020-0101382.

* cited by examiner

100

POWER CONVERSION DEVICE

CROSS-REFERENCE TO RELATED PATENT APPLICATIONS

This application is a U.S. National Stage Application under 35 U.S.C. § 371 of PCT Application No. PCT/KR2021/010727, filed Aug. 12, 2021, which claims priority to Korean Patent Application No. 10-2020-0101382, filed Aug. 12, 2020, whose entire disclosures are hereby incorporated by reference.

TECHNICAL FIELD

The present embodiment relates to a power conversion device.

BACKGROUND ART

Recently, countries around the world are making various attempts to replace existing fossil energy resources. First of all, for the use of nature-friendly energy, intensive investment in the renewable energy industry for the use of nature-friendly energy and the energy distribution and storage industry for energy efficiency improvement has been going on, and in Korea, various policies for the energy industry are being planned and underway due to the shutdown of nuclear power plants and power outages following the earthquake in Japan, and looking at this trend of the times, demand for new and renewable energy is increasing, and in line with this, technologies for efficiently managing power, such as smart grids, are also being actively researched.

The problem of using energy efficiently leads to an analysis of demand patterns such as the place and time of users who use energy, and the core concept of smart grid is how to distribute the produced energy in consideration of the user's demand patterns.

Therefore, in order to store the produced energy in a certain time or space and supply it according to the usage pattern of the consumer, a storage device in which the produced energy can be stored, that is, a battery, is required, and the concept of expanding these batteries is called an energy storage system (ESS).

An energy storage system (ESS) is an energy storage system that controls various voltages and currents generated from distributed power or renewable energy to connect to a power system as needed or to store and use idle energy. The power conversion system (PCS) is a system that converts characteristics of electricity, that is, AC/DC, voltage, frequency, and the like to receive power from a power source inside the energy storage system (ESS) and store it in a battery or discharge it to the grid.

As an example of a power conversion device, a DC-DC converter refers to an electronic circuit device that converts DC power of a certain voltage to DC power of another voltage, and it is used in various fields such as television receivers, automotive electronic parts, and energy storage systems (ESS).

The outer shape of the power conversion device is formed by the housing, and a number of electronic components for driving are disposed inside the housing. The plurality of electronic components generates heat by being driven. Since the generated heat affects the operation of electronic components, a heat dissipation means in the housing is an essential factor to be considered.

As an example of the heat dissipation means, a structure in which outside air is introduced into the housing and the introduced air is circulated through the housing and then discharged has been proposed, however, as external foreign substances including dust and moisture are introduced together along with the inflow of outside air, there is a problem of contaminating the space inside the housing.

DETAILED DESCRIPTION OF THE INVENTION

Technical Subject

The present embodiment is to provide a power conversion device capable of improving heat dissipation efficiency by improving the structure.

Technical Solution

A power conversion device according to the present embodiment comprises: a housing having a space therein, and including a first opening and a second opening; an electronic component being disposed in the space; a duct having one end coupled to the first opening and the other end coupled to the second opening, and having a flow path through which air flows and which is being partitioned from the space; and a fan which is disposed at one end of the duct and which allows air to flow in the flow path, wherein the electronic component includes a radiation fin being protruded from a side surface thereof, and a coupling groove to which the radiation fin is coupled is disposed on a side surface of the duct.

An accommodating groove accommodating the fan may be disposed at one end of the duct.

On an upper surface of the duct, a plurality of first coupling portions being protruded upward and disposed to face each other with respect to the central groove is disposed, and a printed circuit board being coupled to upper ends of the plurality of first coupling portions may be included.

At least one element is disposed on a lower surface of the printed circuit board, and the element may be disposed in the central groove.

The length of the element in an up and down direction may correspond to the length of the central groove in an up and down direction.

A separation part separating the duct from a bottom surface of the space may be disposed at a lower portion of the duct.

The space may be partitioned into a plurality of mutually symmetric regions with respect to the duct.

A fin being protruded inward from an inner surface of the duct may be disposed in the flow path.

The flow path has a rectangular cross section, and the fins are disposed in regions forming each side of the flow path, and a plurality of the fins is provided with respect to a single side of the flow path so that the length being protruded from an inner surface of the duct may be shortened as it travels closer to a corner.

The radiation fin is provided in plural, the radiation fins have different lengths being protruded from the side surface of the electronic component, and the coupling groove may have a plurality of bottom surfaces being disposed to have a step with each other so that the radiation fins are complementarily coupled to one another.

Advantageous Effects

According to the present invention, since heat in the power conversion device is discharged through air flowing through the duct, there is an advantage in that heat dissipation efficiency is improved.

In particular, by forming an air flow path being partitioned from the space inside the housing, there is an advantage in preventing external foreign substances including dust and moisture from entering into the housing.

In addition, heat generated by the electronic component is directly transferred to a flow path in the duct through a radiation fin being extended from the electronic component, thereby improving heat dissipation efficiency.

BEST MODE

Hereinafter, preferred embodiments of the present invention will be described in detail with reference to the accompanying drawings.

However, the technical idea of the present invention is not limited to some embodiments to be described, but may be implemented in various forms, and inside the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

A power conversion device according to the present embodiment may be a DC-DC converter. A converter is an electronic device provided in a vehicle and refers to an electronic circuit device that converts a power source of a certain voltage into a power source of another voltage. However, the configuration according to the present embodiment is not limited thereto, and the heat dissipation structure according to the present embodiment may be applied inside various electronic devices.

Figure 1:
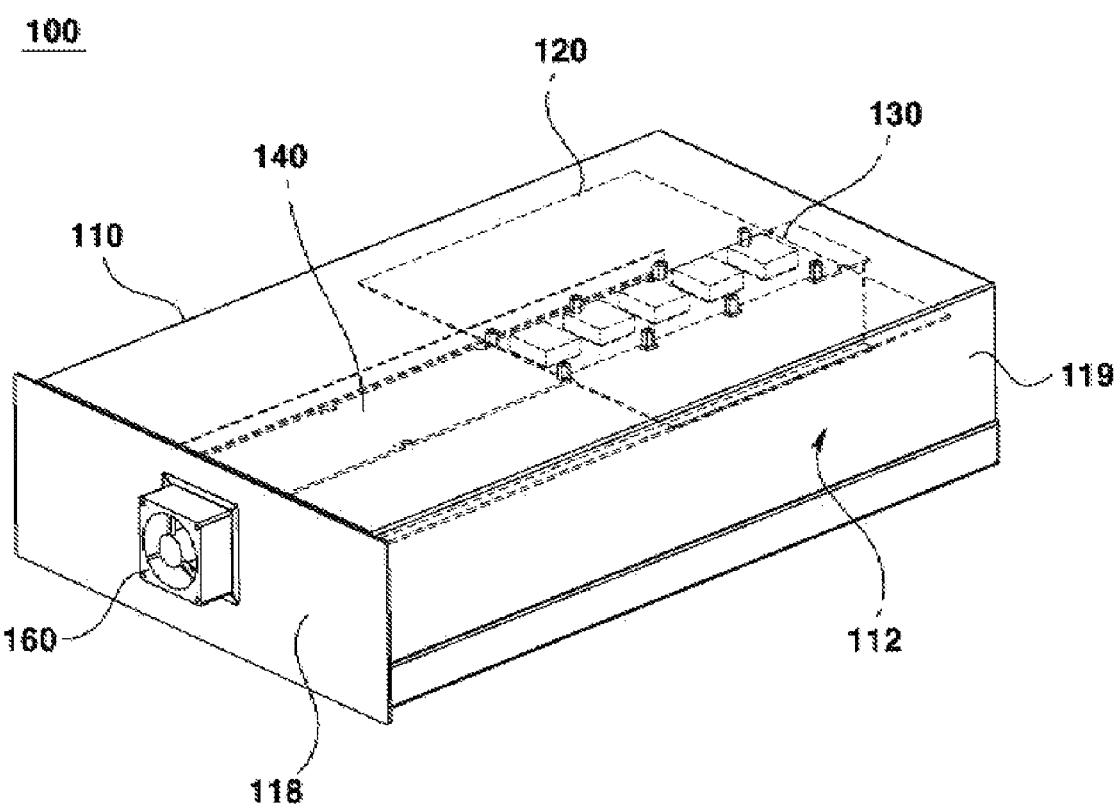
FIG. 1 is a conceptual diagram of a power conversion device according to an embodiment of the present invention.
Figure 2:
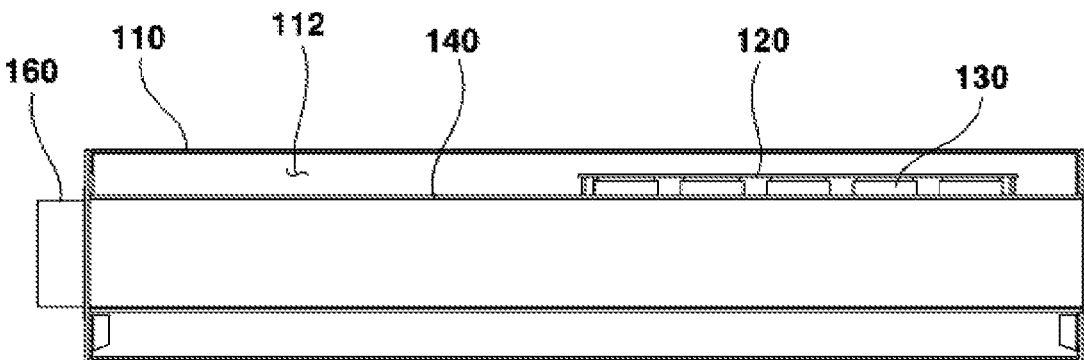
FIG. 2 is a cross-sectional view inside a power conversion device according to an embodiment of the present invention.
Figure 3:
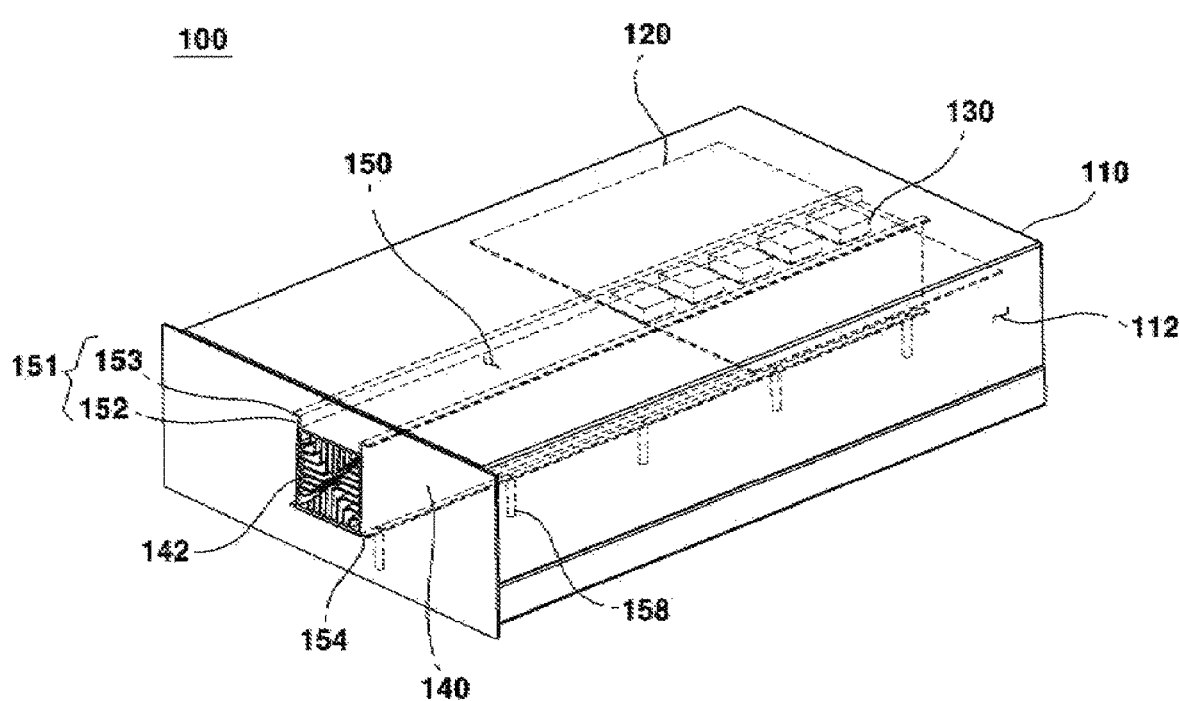
FIG. 3 is a perspective view illustrating the internal configuration of a power conversion device according to an embodiment of the present invention.
Figure 4:
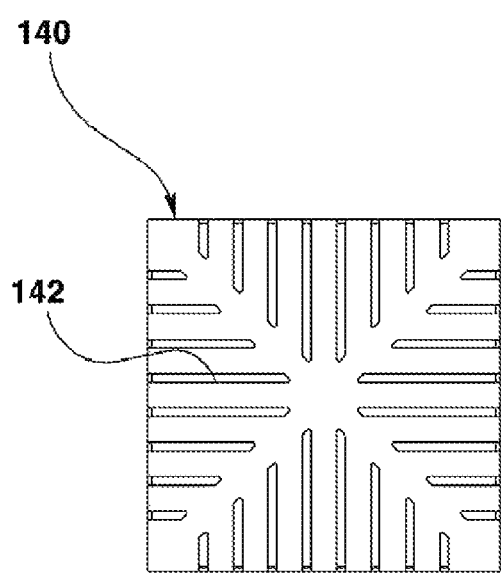
FIG. 4 is a cross-sectional view of a duct according to an embodiment of the present invention.
Figure 5:
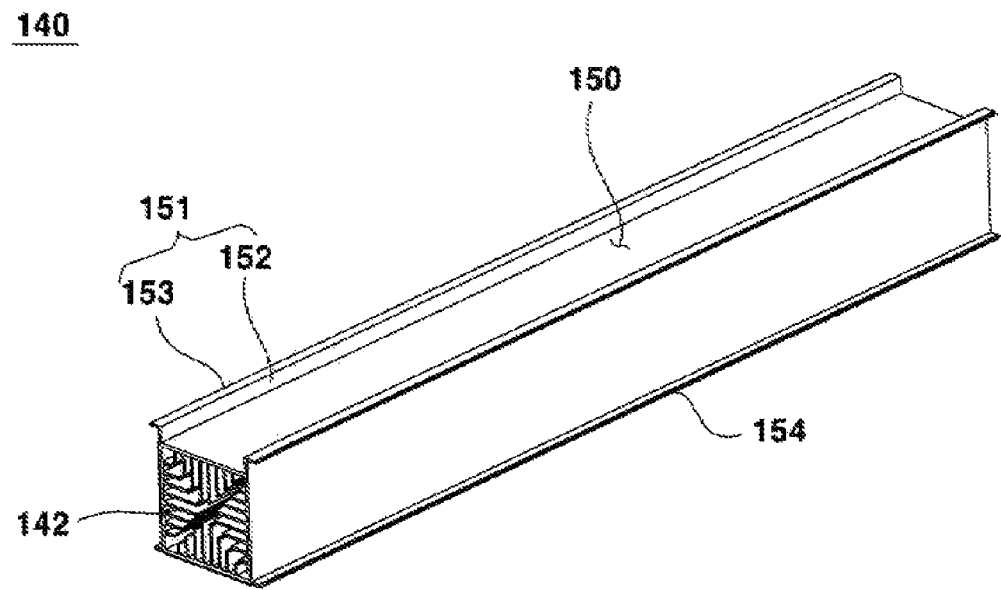
FIG. 5 is a perspective view of a duct according to an embodiment of the present invention.

FIG. 1 is a conceptual diagram of a power conversion device according to an embodiment of the present invention; FIG. 2 is a cross-sectional view inside a power conversion device according to an embodiment of the present invention; FIG. 3 is a perspective view illustrating the internal configuration of a power conversion device according to an embodiment of the present invention; FIG. 4 is a cross-sectional view of a duct according to an embodiment of the present invention; and FIG. 5 is a perspective view of a duct according to an embodiment of the present invention.

Referring to FIGS. 1 to 5, the outer shape of the power conversion device 100 according to an embodiment of the present invention may be formed by the housing 110. The housing 110 may have a rectangular parallelepiped or regular hexahedron shape. The housing 110 may have a space 112 in which at least one electronic component is disposed.

A first opening may be disposed on one side surface 118 of the housing 110 and a second opening may be disposed on the other side surface 119 of the housing 110. The first opening and the second opening may be formed to penetrate through an inner surface of the housing 110 from an outer surface. Both ends of the duct 140, which will be described later, may be coupled to the first opening and the second opening. One side surface 118 and the other side surface 119 of the housing 110 may be surfaces facing each other.

An electronic component may be disposed in the space 112. For example, a printed circuit board 120 and an element 130 being disposed on an outer surface of the printed circuit board 120 may be disposed in the space 112.

A duct 140 may be disposed in the space 112. Both ends of the duct 140 may be coupled to the first opening and the second opening. A flow path through which air flows may be formed inside the duct 140. Outside air introduced from the first opening may be discharged through the second opening along a flow path inside the duct 140. The flow path may be a space partitioned from the space 112.

The duct 140 may be formed in a rectangular parallelepiped shape. When the housing 110 has a rectangular cross section, the duct 140 may be disposed parallel to a region forming a long side of the housing 110. Both ends of the duct 140 may be disposed at the center of one side surface 118 of the housing 110 and the center of the other side surface 119 of the housing 110, respectively. Accordingly, the duct 140 may be disposed at the center of the space 112. With respect to the duct 140, the space 112 may be partitioned into a plurality of mutually symmetrical regions.

A fin 142 may be disposed in a flow path inside the duct 140. The fin 142 may be formed to be protruded inward from an inner surface of the duct 140. Accordingly, the contact area with air flowing through the flow path through the fin 142 is increased, and the heat dissipation efficiency can be improved.

The fin 142 may be provided in plural and spaced apart from one another. When the flow path has a rectangular cross-sectional shape, as illustrated in FIG. 4, the fin 142 may be disposed in regions forming sides of the flow path. At this time, based on a single side, the fin 142 may be provided in plural and spaced apart from one another. In addition, the plurality of fins 142 being disposed along a single side may be disposed so that the length being protruded from an inner surface of the duct 140 becomes shorter as it travels closer to a corner of the flow path. Accordingly, the length of the fin 142 disposed at the center of any one side may be longer than the length of the fin 142 disposed at the edge.

Meanwhile, the fin 142 may be disposed to correspond only to a region facing the element 130 among flow paths in the duct 140. In this case, a hollow portion may be formed in the flow path except the region where the fin 142 is disposed.

The power conversion device 100 may include a fan 160. The fan 160 may be disposed on an outer surface of the housing 110. The fan 160 may be coupled to one end of the duct 140. The fan 160 may be coupled to the first opening formed on the one side surface 118. The fan 160 may suck air from an external region and discharge it to the flow path. The fan 160 may flow air inside the duct 140. The fan 160 may flow air from one end of the duct 140 toward the other end.

Referring to FIG. 5, a first coupling portion 151 may be disposed on an upper portion of the duct 140 and a second coupling portion 154 may be disposed on a lower portion of the duct 140. The first coupling portion 151 and the second coupling portion 154 may be disposed on an outer surface of the duct 140 and formed integrally with the duct 140.

The first coupling portion 151 may include a first extension part 152 being extended upward from an upper surface of the duct 140 and a second extension part 153 being extended outward from an upper end of the first extension part 152. The first coupling portion 151 may be disposed along the lengthwise direction of the duct 140. The first coupling portion 151 may be provided in plural and disposed facing each other with respect to the central groove 150. A first screw hole penetrating a lower surface from an upper surface may be formed in the second extension part 153.

The printed circuit board 120 may be coupled to an upper portion of the duct 140. One or more elements 130 may be disposed on a lower surface of the printed circuit board 120. The element 130 may be disposed in the central groove 150. The height of the element 130 may correspond to the height of the first extension part 152. The length of the element 130 in an up and down directions may correspond to the length from the bottom surface of the central groove 150 to a lower surface of the printed circuit board 120. The lower surface of the element 130 may come into contact with the bottom surface of the central groove 150. A second screw hole may be formed in a region of the printed circuit board 120 facing the first screw holes in an up and down direction. Accordingly, the printed circuit board 120 may be firmly fixed on the duct 140 through screw-coupling into the first screw hole and the second screw hole.

The second coupling portion 154 may be formed to be extended outward from a lower end of the duct 140. The second coupling portion 154 may be provided in plural and may be respectively disposed on an outer side surface of a lower end of the duct 140. The second coupling portion 154 may be disposed to be parallel to the second extension part 153. The second coupling portion 154 may be disposed to be overlapped with the second extension part 153 in an up and down direction. A third screw hole penetrating through a lower surface from an upper surface may be formed in the second coupling portion 154.

A separation part 158 separating the duct 140 from the bottom surface of the space 112 may be disposed at a lower portion of the duct 140. The separation part 158 may have a lower end being coupled to a bottom surface of the space 112 and an upper end being coupled to a lower surface of the second coupling portion 154. A fourth screw hole may be disposed on an upper surface of the separation part 158. Accordingly, a screw may penetrate through the third screw hole and be screw-coupled into the fourth screw hole. The separation part 158 may be provided in plural and spaced apart along the edge of the duct 140.

According to the structure as described above, since heat inside the power conversion device is discharged through the air flowing through the duct, there is an advantage in that heat dissipation efficiency is improved.

In particular, by forming an air flow path partitioned from the space inside the housing, there is an advantage in preventing external foreign substances including dust and moisture from entering into the housing.

Figure 6:
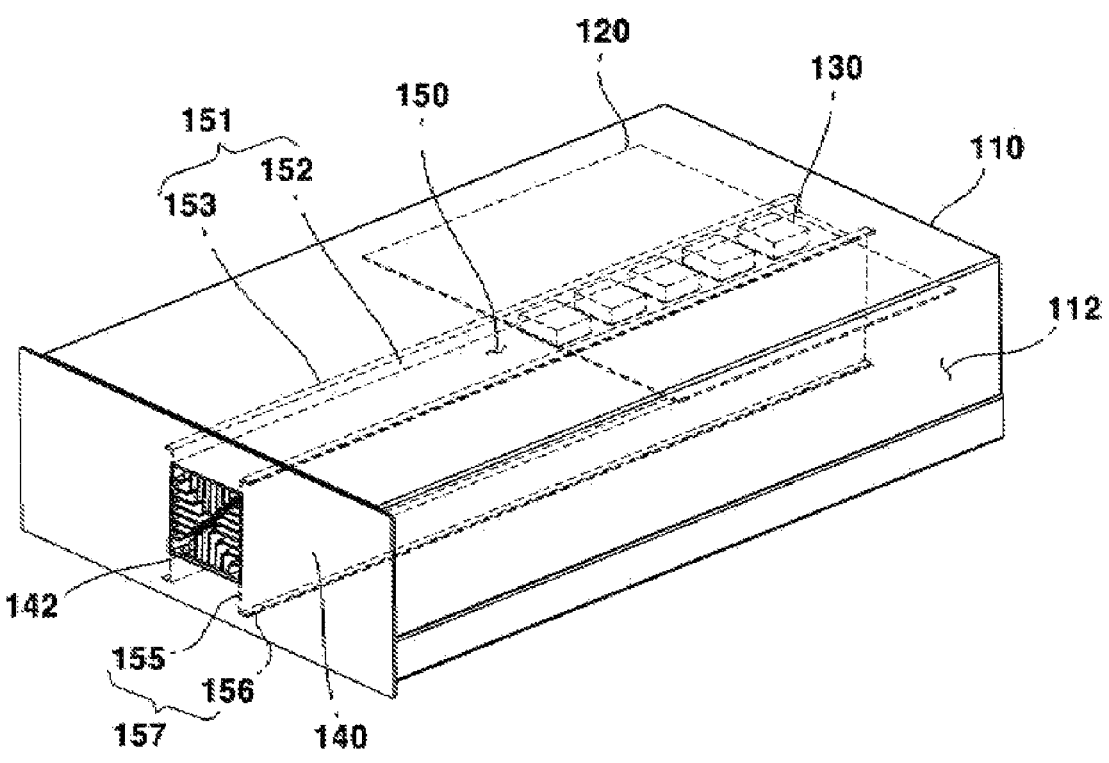
FIG. 6 is a perspective view illustrating the internal configuration of a power conversion device to which a modified embodiment of the duct according to the present invention is applied.

FIG. 6 is a perspective view illustrating the internal configuration of a power conversion device to which a modified embodiment of the duct according to the present invention is applied.

In the present modified embodiment, instead of disposing the second coupling portion 154 and the separation part 158 in a lower portion of the duct 140, A third coupling portion 157 including a third extension part 155 being extended downward from a lower surface of the duct 140 and a fourth extension part 156 being bent outward from a lower end of the third extension part 155 may be provided. Accordingly, the aforementioned separation part 158 may be omitted.

In detail, the third extension part 155 is extended downward from a lower surface of the duct 140 so that the duct 140 can be separated from the bottom surface of the space 112.

The fourth extension part 156 may be bent outward from a lower end of the third extension part 155 and screw-coupled to the bottom surface of the space 112. To this end, a screw hole penetrating a lower surface from an upper surface may be formed in the fourth extension part 156.

The third coupling portion 157 is provided in plural and disposed to face one another. At least one electronic component for driving the power conversion device 100 may be disposed in a space between the plurality of third coupling portions 157.

Figure 7:
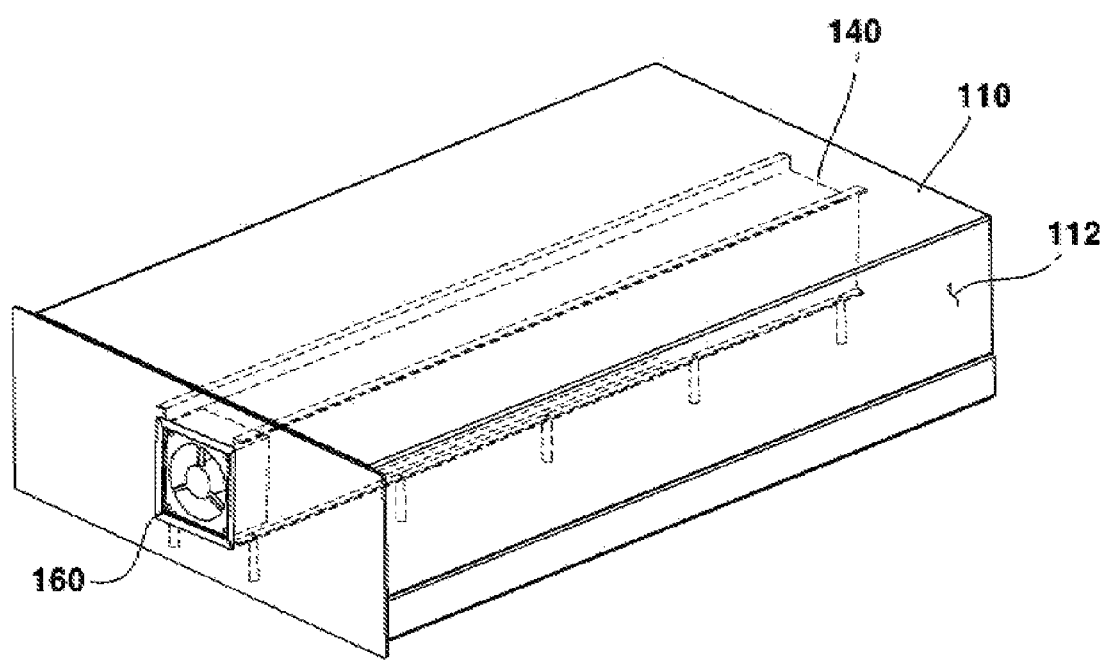
FIG. 7 is a perspective view illustrating the internal configuration of a power conversion device to which a modified embodiment of the fan and duct coupling structure according to the present invention is applied.
Figure 8:
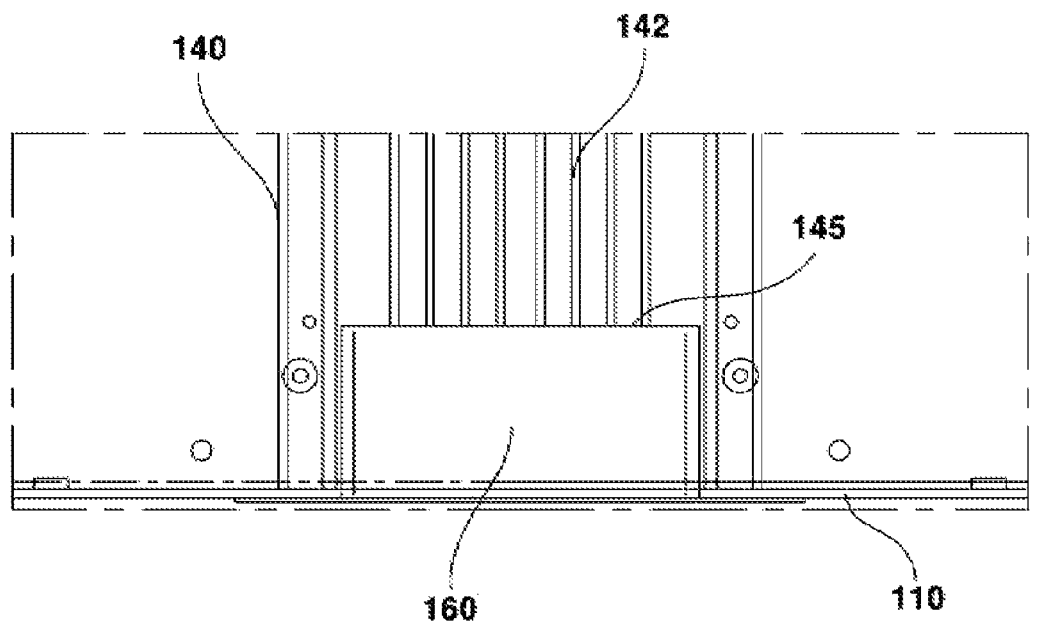
FIG. 8 is a cross-sectional view of the fan and duct coupling structure of FIG. 7.

FIG. 7 is a perspective view illustrating the internal configuration of a power conversion device to which a modified embodiment of the fan and duct coupling structure according to the present invention is applied; and FIG. 8 is a cross-sectional view of the fan and duct coupling structure of FIG. 7.

Referring to FIGS. 7 and 8, in the present modified embodiment, the duct 160 may be disposed inside the housing 110 instead of being disposed on an outer surface of the housing 110. To this end, one end of the duct 140 may be provided with an accommodating groove 145 that is formed by being recessed more than other regions and accommodates the duct 140. The duct 140 may be disposed inside the accommodating groove 145. An outer surface of the duct 140 may form the same plane as an outer surface of the housing 110. An outer end portion of the duct 160 may be accommodated in the first opening of the housing 110. Accordingly, the duct 140 may communicate with an outer region of the housing 110 through the first opening to suck in outside air and discharge air to a flow path inside the duct 140. The aforementioned fin 142 may not be disposed in a region in which the fan 160 is disposed among a space inside the duct 140.

Figure 9:
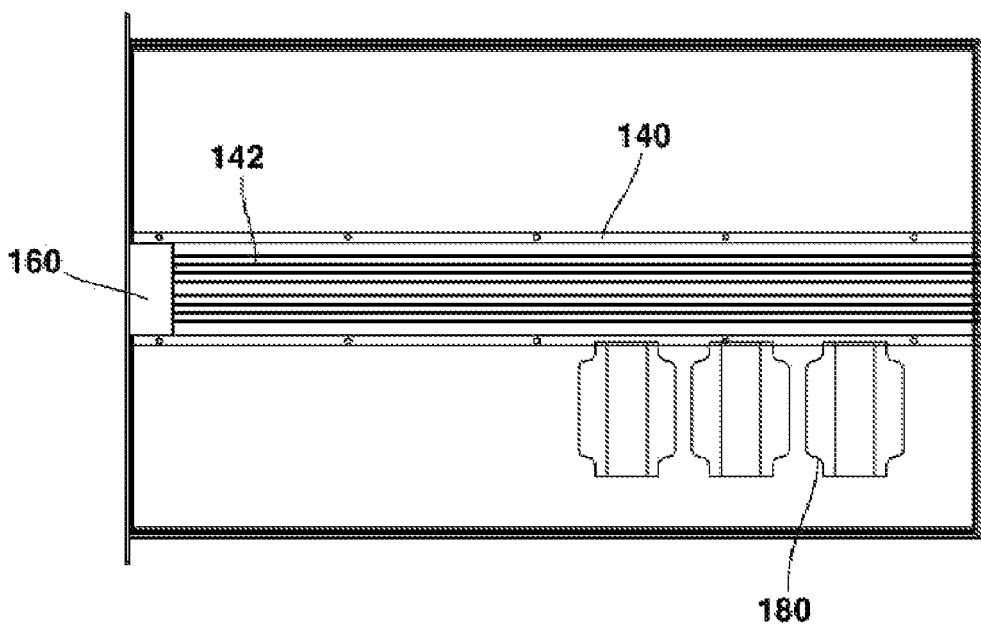
FIG. 9 is a top plan view of a space inside a housing according to a second embodiment of the present invention.
Figure 10:
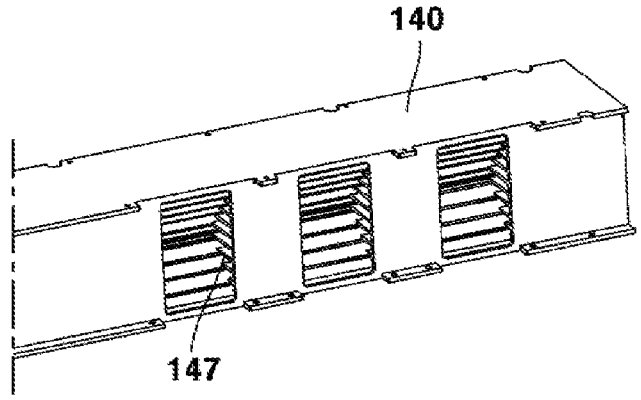
FIG. 10 is a perspective view of a duct according to a second embodiment of the present invention.

FIG. 9 is a top plan view of a space inside a housing according to a second embodiment of the present invention; FIG. 10 is a perspective view of a duct according to a second embodiment of the present invention; and FIG. 11 is a perspective view of an electronic component according to a second embodiment of the present invention.

In the present embodiment, other portions are the same as in the previous embodiment, and there is a difference in that electronic components are coupled to an outer surface of the duct. Hereinafter, only the characteristic portions of the present embodiment will be described, and for the remaining portions, descriptions for the previous embodiments will be used.

Figure 11:
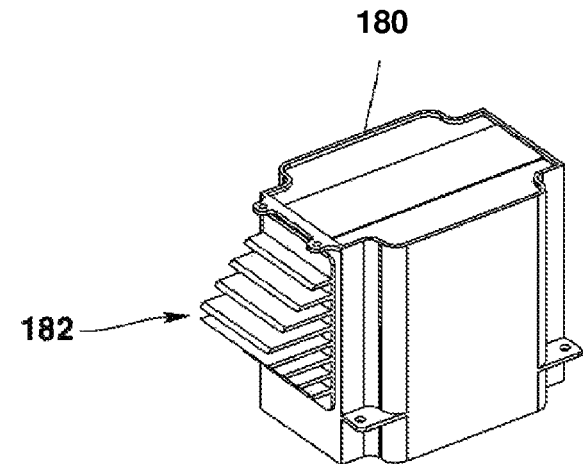
FIG. 11 is a perspective view of an electronic component according to a second embodiment of the present invention.

Referring to FIGS. 9 to 11, an electronic component 180 may be disposed in a space inside the power control device according to the present embodiment. The electronic component 180 is a component related to the driving of the power control device and may be coupled to a side surface of the duct 140. The electronic component 180 may be provided in plural and may be disposed to be spaced apart from one another along the lengthwise direction of the duct 140.

A radiation fin 182 being protruded from a side surface of the electronic component 180 may be disposed on a side surface of the electronic component 180 facing the side surface of the duct 140. The radiation fins 182 may be provided in plural and spaced apart from one another along an up and down direction. The heights of the plurality of radiation fins 182 being protruded from the side surface of the electronic component 180 may be different from one another. For example, the plurality of radiation fins 182 may be disposed in a way that the length being protruded from a side surface of the electronic component 180 is shortened as it is getting closer to the edges of an upper and lower end. The plurality of radiation fins 182 may be disposed to have a step with each other.

A coupling groove 147 to which the radiation fin 182 is coupled may be formed on a side surface of the duct 140. The coupling groove 147 may be formed in a shape complementary to that of the radiation fin 182. Accordingly, the coupling groove 147 may include a plurality of bottom surfaces being disposed to have a step with each other. The bottom surface may be formed by changing an arrangement shape of fins being disposed inside the duct 140. The coupling grooves 147 may be provided in plural to correspond to the number of the electronic components 180.

According to the above structure, the heat generated by the electronic component 180 is directly transferred to the flow path inside the duct 140 through the radiation fin 182 being extended from the electronic component 180, so the heat dissipation efficiency can be improved.

In the above description, it is described that all the components constituting the embodiments of the present invention are combined or operated in one, but the present invention is not necessarily limited to these embodiments. In other words, inside the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas inside the equivalent scope should be interpreted as being included in the scope of the present invention.

The invention claimed is:

1. A power conversion device comprising:
a housing having a space therein, and including a first opening and a second opening;
an electronic component being disposed in the space;
a duct having one end coupled to the first opening and other end coupled to the second opening, and having a flow path through which air flows and which is being partitioned from the space; and
a fan which is disposed at one end of the duct and which allows air to flow in the flow path,
wherein the electronic component includes a radiation fin being protruded from a side surface thereof,
wherein a coupling groove to which the radiation fin is coupled is disposed on a side surface of the duct,
wherein the radiation fin is provided in plural,
wherein the radiation fins have different lengths being protruded from the side surface of the electronic component, and
wherein the coupling groove has a plurality of bottom surfaces being disposed to have a step with each other so that the radiation fins are complementarily coupled to one another.

2. The power conversion device according to claim 1, wherein an accommodating groove accommodating the fan is disposed at one end of the duct.

3. The power conversion device according to claim 1, wherein on an upper surface of the duct, a plurality of first coupling portions being protruded upward and disposed to face each other with respect to a central groove is disposed, and wherein a printed circuit board being coupled to upper ends of the plurality of first coupling portions is included.

4. The power conversion device according to claim 3, wherein at least one element is disposed on a lower surface of the printed circuit board, and wherein the element is disposed in the central groove.

5. The power conversion device according to claim 4, wherein a length of the element in an up and down direction corresponds to a length of the central groove in the up and down direction.

6. The power conversion device according to claim 1, wherein a separation part separating the duct from a bottom surface of the space is disposed at a lower portion of the duct.

7. The power conversion device according to claim 1, wherein the space is partitioned into a plurality of mutually symmetric regions with respect to the duct.

8. The power conversion device according to claim 1, wherein a fin being protruded inward from an inner surface of the duct is disposed in the flow path.

9. The power conversion device according to claim 8, wherein the flow path has a rectangular cross section, wherein the fins are disposed in regions forming each side of the flow path, and wherein a plurality of fins are provided with respect to a single side of the flow path so that a length of the fins being protruded from an inner surface of the duct is shortened as it travels closer to a corner of the flow path, and wherein the fins are disposed in regions forming each side of the flow path.

10. The power conversion device according to claim 1, wherein a length of the plurality of radiation fins protruding from the side surface of the electronic component becomes shorter as they are closer to an upper and lower ends of the electronic component.

11. The power conversion device according to claim 1, wherein the fan is disposed on an outer surface of the housing.

12. The power conversion device according to claim 1, wherein the housing has a rectangular cross-sectional shape, and wherein the duct is disposed parallel to a long side of the housing.

13. The power conversion device according to claim 1, wherein the electronic component is provided in plurality and disposed along a longitudinal direction of the duct.

14. The power conversion device according to claim 1, comprising a third extension extending downward from a lower surface of the duct and a fourth extension extending outward from a lower end of the third extension, wherein a lower surface of the duct is spaced apart from a bottom surface of the housing.

15. A power conversion device comprising:
a housing having a space therein, and including a first opening and a second opening;
a duct having one end coupled to the first opening and other end coupled to the second opening, and having a flow path through which air flows and which is being partitioned from the space;
a printed circuit board disposed on the duct; and
an element disposed on the lower surface of the printed circuit board and facing the duct,
wherein a plurality of first coupling portions protruding upward and facing each other are disposed on an upper surface of the duct, and
wherein a central groove in which the element is disposed is formed between the plurality of first coupling portions.

16. The power conversion device according to claim 15, wherein a vertical length of the element corresponds to a vertical length of the center groove.

17. The power conversion device according to claim 15, wherein a fin being protruded inward from an inner surface of the duct is disposed in the flow path.

18. The power conversion device according to claim 17, wherein the flow path has a rectangular cross section, wherein a plurality of fins are provided with respect to a single side of the flow path so that a length of the fins being protruded from an inner surface of the duct is shortened as it travels closer to a corner of the flow paths, and wherein the fins are disposed in regions forming each side of the flow path.

* * * * *